United States Patent
Lee

(10) Patent No.: US 9,535,128 B2
(45) Date of Patent: Jan. 3, 2017

(54) TEST PATH COMPENSATING CIRCUIT AND TEST PATH COMPENSATING SYSTEM

(71) Applicant: SK hynix Inc., Icheon-si, Gyeonggi-do (KR)

(72) Inventor: Seong Ju Lee, Namyangjusi Gyeonggi-do (KR)

(73) Assignee: SK HYNIX INC., Icheon-Si (KR)

( * ) Notice: Subject to any disclaimer, the term of this patent is extended or adjusted under 35 U.S.C. 154(b) by 149 days.

(21) Appl. No.: 14/644,479

(22) Filed: Mar. 11, 2015

(65) Prior Publication Data

US 2016/0109520 A1 Apr. 21, 2016

(30) Foreign Application Priority Data

Oct. 20, 2014 (KR) .................. 10-2014-0142088

(51) Int. Cl.
| | |
|---|---|
| G01R 31/319 | (2006.01) |
| G01R 31/30 | (2006.01) |
| G01R 31/3193 | (2006.01) |
| G01R 31/317 | (2006.01) |
| G11C 29/12 | (2006.01) |
| G11C 29/48 | (2006.01) |

(52) U.S. Cl.
CPC ... G01R 31/31924 (2013.01); G01R 31/31726 (2013.01); G01R 31/31937 (2013.01); G11C 29/1201 (2013.01); G11C 29/48 (2013.01)

(58) Field of Classification Search
CPC .................. G11C 29/48; G11C 29/1201; G01R 31/31924; G01R 31/31726; G01R 31/31937

USPC ...................................................... 324/750.01
See application file for complete search history.

(56) References Cited

U.S. PATENT DOCUMENTS

| | | | | |
|---|---|---|---|---|
| 8,593,197 | B1* | 11/2013 | Cheng | .................. H03L 7/0812 327/149 |
| 2005/0246598 | A1* | 11/2005 | Minzoni | .............. G11C 29/028 714/724 |
| 2006/0152236 | A1 | 7/2006 | Kim | |
| 2008/0180127 | A1 | 7/2008 | Kim | |

FOREIGN PATENT DOCUMENTS

KR         1020060039655 A      5/2006

* cited by examiner

*Primary Examiner* — Billy Lactaoen
(74) *Attorney, Agent, or Firm* — William Park & Associates Ltd.

(57) ABSTRACT

A test path compensating circuit may include a plurality of electrical paths electrically coupling a plurality of test pads to a test target circuit. The test path compensating circuit may include a control voltage generation circuit configured to generate a plurality of control voltages. The test path compensating circuit may include a plurality of voltage-control delay circuits electrically coupled to the plurality of electrical paths, respectively, and configured to control delay amounts of input test signals received from one or more of the plurality of test pads, based on one or more of the plurality of control voltages, and provide output test signals to the test target circuit.

20 Claims, 8 Drawing Sheets

TEST PATH COMPENSATING CIRCUIT AND TEST PATH COMPENSATING SYSTEM

CROSS-REFERENCES TO RELATED APPLICATION

The present application claims priority under 35 U.S.C. §119(a) to Korean application number 10-2014-0142088, filed on Oct. 20, 2014, in the Korean Intellectual Property Office, which is incorporated herein by reference in its entirety.

BACKGROUND

1. Technical Field

Various embodiments generally relate to a test path compensating circuit and a test path compensating system, and more particularly, to a test path compensating circuit and a test path compensating system for compensating for the paths of input test signals received through test pads, to perform a test.

2. Related Art

As the demand toward electronic devices increases, especially with devices that are convenient for carrying, so does the need to have the component elements and devices disposed within the electronic devices scaled down. The component elements disposed in the electronic devices are electrically coupled through electrical paths. The Electrical paths electrically coupling a multitude of component elements have different lengths.

In particular, in the case of testing an electronic device, test patterns should be inputted to a circuit to be tested, with the same timing. However, differences are caused in times at which test patterns reach the circuit to be tested, according to not only differences in the lengths of electrical paths but also a variation in PVT (process, voltage and temperature). In devices scaled down, such time differences may impede the acquisition of a precise testing result.

SUMMARY

In an embodiment, test path compensating circuit may include a plurality of electrical paths electrically coupling a plurality of test pads to a test target circuit. The test path compensating circuit may include a control voltage generation circuit configured to generate a plurality of control voltages. The test path compensating circuit may include a plurality of voltage-control delay circuits electrically coupled to the plurality of electrical paths, respectively, and configured to control delay amounts of input test signals received from one or more of the plurality of test pads, based on one or more of the plurality of control voltages, and provide output test signals to the test target circuit.

In an embodiment, a test path compensating system may include test equipment configured to provide input test signals and an external control signal. The test path compensating system may include a test path compensating circuit configured to receive the input test signals through a plurality of test pads, linearly control delay amounts of the input test signals, based a plurality of control voltages generated based on the external control signal, and provide the input test signals as output test signals.

DETAILED DESCRIPTION

Hereinafter, a test path compensating circuit and a test path compensating system will be described below with reference to the accompanying drawings through various examples of embodiments.

Various embodiments may be directed to a test path compensating circuit and a test path compensating system for finely controlling differences in electrical paths extending from a plurality of test pads to a target circuit to be tested.

Various embodiments may be directed to a test path compensating circuit and a test path compensating system for compensating for differences in electrical paths extending from test pads to a target circuit to be tested, through a simple configuration.

In the test path compensating circuit and the test path compensating system according to the embodiments, since the delay amounts of input test signals may be linearly controlled through analog circuits, fine delay amount control may be capable.

In the test path compensating circuit and the test path compensating system according to the embodiments, since a voltage provided from an exterior is used to control the delay amounts of the input test signals provided through various paths, path compensation may be flexibly performed according to operation characteristics.

Figure 1:
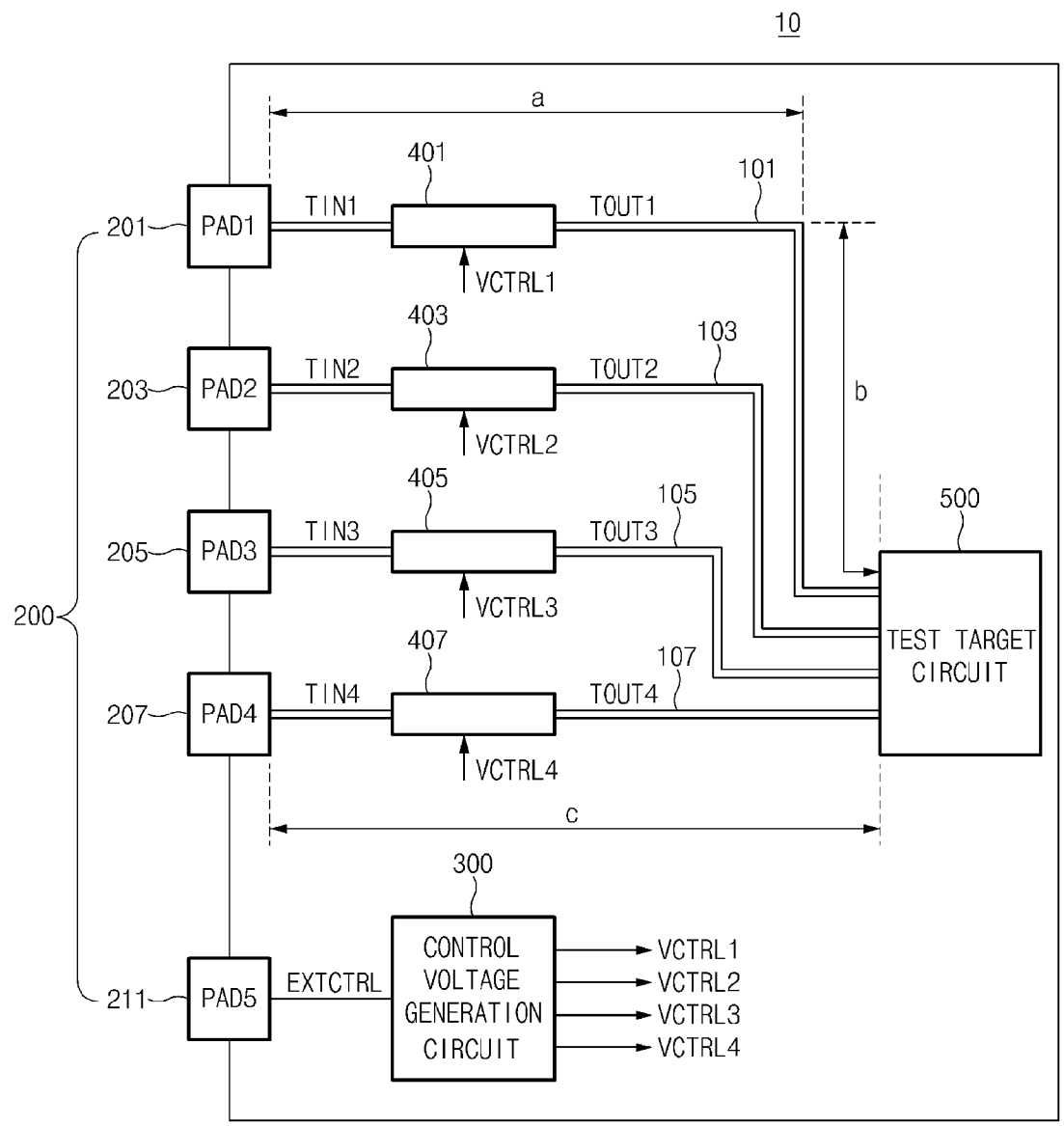
FIG. 1 is a block diagram illustrating a representation of an example of a test path compensating circuit in accordance with an embodiment.

FIG. 1 is a block diagram illustrating a representation of an example of a test path compensating circuit in accordance with an embodiment.

Referring to FIG. 1, a test path compensating circuit 10 may include a plurality of pads 200, a plurality of electrical paths 101, 103, 105 and 107, and a plurality of voltage-control delay circuits 401, 403, 405 and 407.

The plurality of pads 200 may include a plurality of test pads 201, 203, 205 and 207. The test pads 201, 203, 205 and 207 may receive input test signals TIN1, TIN2, TIN3 and TIN4 from an exterior of the test path compensating circuit or respective test pads. The plurality of pads 200 may include a pad 211 configured to receive an external control signal EXTCTRL.

The test path compensating circuit 10 may be positioned on one substrate including the plurality of pads 200. The input test signals TIN1, TIN2, TIN3 and TIN4 inputted through the plurality of pads 200 are provided to a test target circuit 500 through the plurality of electrical paths 101, 103, 105 and 107, respectively.

As the test target circuit 500 receives the input test signals TIN1, TIN2, TIN3 and TIN4 provided from the exterior and provides responsive test results to the exterior, the test target circuit 500 is tested in terms of whether it operates normally or not. For example, if the applied input test signals TIN1, TIN2, TIN3 and TIN4 are not fed back precisely as test results, it may be determined that a fail has occurred in the test target circuit 500.

However, in this regard, not attributable to a fail of the test target circuit 500 itself but attributable to differences in times at which the input test signals TIN1, TIN2, TIN3 and TIN4 reach the test target circuit 500, the test target circuit 500 may differently recognize the input test signals TIN1, TIN2, TIN3 and TIN4 and may transmit erroneous test results. Therefore, the precise test of the test target circuit 500 may be impossible.

Referring to FIG. 1, the length of the electrical path 101 extending from the first pad 201 to the test target circuit 500 may be represented by approximately 'a+b'. Conversely, the length of the electrical path 107 extending from the fourth pad 207 to the test target circuit 500 may be represented by approximately 'c'.

Because the lengths of the electrical paths are different in this way, even though the time at which the first input test signal TIN1 is inputted to the first pad 201 and the time at which the fourth input test signal TIN4 is inputted to the fourth pad 207 are the same with each other, the first input test signal TIN1 may reach the test target circuit 500 later than the time it takes the fourth input test signal TIN4 to reach the test target circuit 500.

In order to compensate for the differences in the electrical paths as described above, the test path compensating circuit 10 in accordance with an embodiment may have the voltage-control path compensating circuits (also referred to as the voltage-control delay circuits) 401, 403, 405 and 407 electrically coupled to the plurality of electrical paths 101, 103, 105 and 107 extending from the test pads 201, 203, 205 and 207 to the test target circuit 500.

The respective voltage-control path compensating circuits 401, 403, 405 and 407 provide the input test signals TIN1, TIN2, TIN3 and TIN4 to the test target circuit 500, as output test signals TOUT1, TOUT2, TOUT3 and TOUT4. The respective voltage-control path compensating circuits 401, 403, 405 and 407 may provide the input test signals TIN1, TIN2, TIN3 and TIN4 to the test target circuit 500, as output test signals TOUT1, TOUT2, TOUT3 and TOUT4 by linearly controlling the delay amounts of the input test signals TIN1, TIN2, TIN3 and TIN4, based on control voltages VCTRL1, VCTRL2, VCTRL3 and VCTRL4.

The voltage-control path compensating circuits 401, 403, 405 and 407 may control the delay amounts linearly inversely proportional to the control voltages VCTRL1, VCTRL2, VCTRL3 and VCTRL4. In the example of linearly controlling the delay amounts, it may be possible to finely control the delay amounts, when compared to the conventional resistor capacitor (RC) delay control scheme.

The configurations of the voltage-control path compensating circuits 401, 403, 405 and 407 will be described with reference to FIG. 2 below. The control voltages VCTRL1, VCTRL2, VCTRL3 and VCTRL4 controlling the voltage-control path compensating circuits 401, 403, 405 and 407 are generated by a control voltage generation circuit 300 (see FIG. 1).

The control voltage generation circuit 300 may generate the plurality of control voltages VCTRL1, VCTRL2, VCTRL3 and VCTRL4 by receiving the external control signal EXTCTRL through the pad 211 (i.e., fifth pad 211).

According to an embodiment, the plurality of control voltages VCTRL1, VCTRL2, VCTRL3 and VCTRL4 may be voltages with the same difference. However, even though the plurality of control voltages VCTRL1, VCTRL2, VCTRL3 and VCTRL4 have the same difference, different values may be generated based on the external control signal EXTCTRL.

The control voltages VCTRL1, VCTRL2, VCTRL3 and VCTRL4 may also be provided to the respective voltage-control delay circuits 401, 403, 405 and 407 through electrical paths on the same substrate, similarly to the electrical paths 101, 103, 105 and 107.

Figure 2:
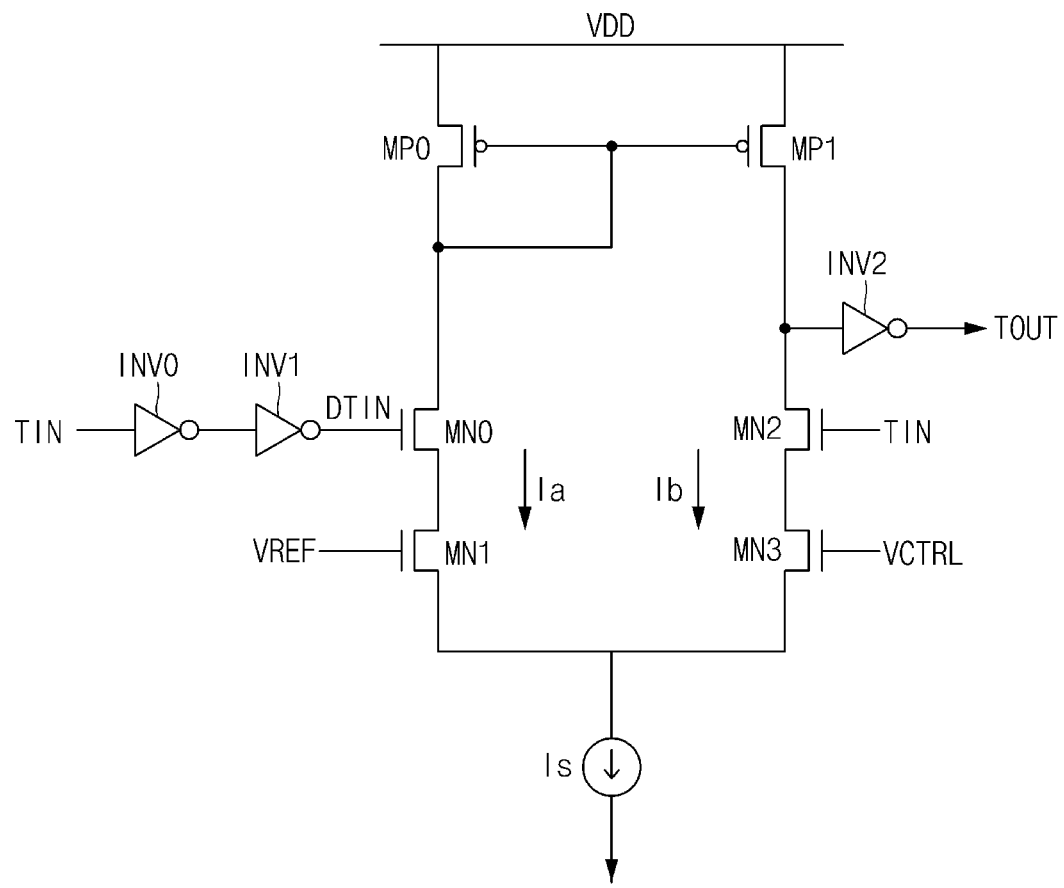
FIG. 2 is a circuit diagram illustrating a representation of an example of a voltage-control delay circuit in accordance with an embodiment.

FIG. 2 is a circuit diagram illustrating a representation of an example of a voltage-control delay circuit in accordance with an embodiment.

Referring to FIG. 2, the voltage-control delay circuit may include an active load in the form of a current mirror configured by first and second PMOS transistors MP0 and MP1. The voltage-control delay circuit may include first to fourth NMOS transistors MN0, MN1, MN2 and MN3, and a common current source Is. The voltage-control delay circuit may include first to third inverters INV0, INV1 and INV2.

The first PMOS transistor MP0 may include a first terminal electrically coupled with a gate terminal and a second terminal electrically coupled with a power supply voltage VDD. The second PMOS transistor MP1 may include a gate terminal electrically coupled with the gate terminal of the first PMOS transistor MP0 and a second terminal electrically coupled with the power supply voltage VDD.

The first PMOS transistor MP0 and the second PMOS transistor MP1, as an active load in the form of a current mirror, may serve to improve drivability for an output test signal TOUT.

A first terminal of the first NMOS transistor MN0 may be electrically coupled with the first terminal of the first PMOS transistor MP0, that is, one end of the active load. The first NMOS transistor MN0 may include a gate terminal configured to be applied with a delayed input test signal DTIN generated as an input test signal TIN delayed through the first and second inverters INV0 and INV1.

The second NMOS transistor MN1 may include a first terminal electrically coupled with a second terminal of the first NMOS transistor MN0. The second NMOS transistor MN1 may include a gate terminal configured to be applied with a reference voltage VREF. The second NMOS transistor MN1 may include a second terminal electrically coupled with the common current source Is.

First current Ia may flow through the first NMOS transistor MN0 and the second NMOS transistor MN1.

The third NMOS transistor MN2 may include a first terminal electrically coupled with an input terminal of the third inverter INV2. The third NMOS transistor MN2 may include a gate terminal configured to be applied with the input test signal TIN. The fourth NMOS transistor MN3 may include a first terminal electrically coupled with a second terminal of the third NMOS transistor MN2. The fourth NMOS transistor MN3 may include a gate terminal configured to be applied with a control voltage VCTRL. The fourth NMOS transistor MN3 may include a second terminal electrically coupled with the common current source Is.

Second current Ib may flow through the third NMOS transistor MN2 and the fourth NMOS transistor MN3.

The first and third NMOS transistors MN0 and MN2 and the second and fourth NMOS transistors MN1 and MN3 may be MOS transistor pairs having the same characteristic or substantially the same characteristic.

The voltage-control delay circuit in accordance with an embodiment may have the configuration of a differential amplifier with a single output, and may provide the output test signal TOUT of which delay amount may be controlled according to the ratio between the reference voltage VREF and the control voltage VCTRL.

Because the sum of the first current Ia and the second current Ib is the same as the common current source Is, an operation is performed in such a manner that the second current Ib decreases if the first current Ia increases relatively.

Based on the ratio between the control voltage VCTRL and the reference voltage VREF, in the example where the control voltage VCTRL is relatively larger than the reference voltage VREF, the value of the second current Ib increases, and the weight of the input test signal TIN becomes relatively larger than the delayed input test signal DTIN when generating the output test signal TOUT. As a result, since the weight of the input test signal TIN which is not delayed increases when generating the output test signal TOUT, the delay amount of the output test signal TOUT relatively decreases.

Conversely, if the reference voltage VREF is larger than the control voltage VCTRL, the value of the first current Ia increases, and the delay amount of the output test signal TOUT relatively increases based on the delayed input test signal DTIN.

In this way, the voltage-control delay circuit in accordance with an embodiment may have an inversely proportional relationship in such a manner that the delay amount of the output test signal TOUT decreases as the control voltage VCTRL increases.

Such control of a delay amount is linearly implemented according to the ratio between the control voltage VCTRL and the reference voltage VREF. Thus, it may be possible to control a delay amount more finely than in the examples of controlling a delay amount by the unit of a predetermined magnitude based on control codes as in a digital control scheme.

Figure 3:
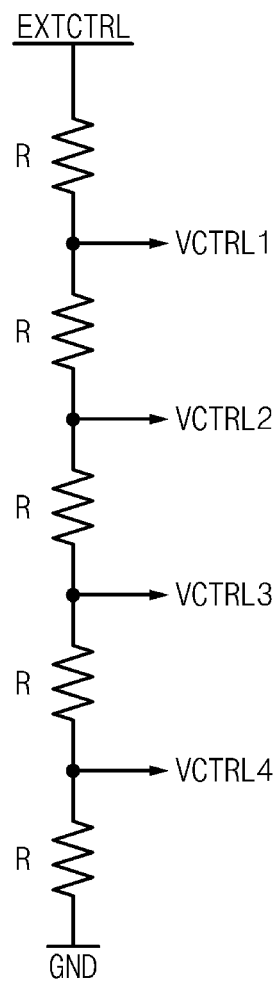
FIG. 3 is a circuit diagram illustrating a representation of an example of a control voltage generation circuit in accordance with an embodiment.

FIG. 3 is a circuit diagram illustrating a representation of an example of a control voltage generation circuit in accordance with an embodiment.

Referring to FIG. 3, the control voltage generation circuit 300 may have the configuration of a resistor divider including a plurality of resistors R.

The plurality of resistors R having the same resistance value or substantially the same resistance value are electrically coupled between the external control signal EXTCTRL and a ground voltage GND. The plurality of control voltages VCTRL1, VCTRL2, VCTRL3 and VCTRL4 are provided from nodes between the resistors R.

While not illustrated, the control voltage generation circuit 300 in accordance with an embodiment may include a voltage regulator, and stably output and provide voltages to the plurality of voltage-control delay circuits 401, 403, 405 and 407.

The plurality of resistors R may not have the same resistance value, and the control voltages VCTRL1, VCTRL2, VCTRL3 and VCTRL4 may have different values to control delay amounts with an aim of compensating for differences in the electrical paths between the test pad 200 and the test target circuit 500.

Figure 4:
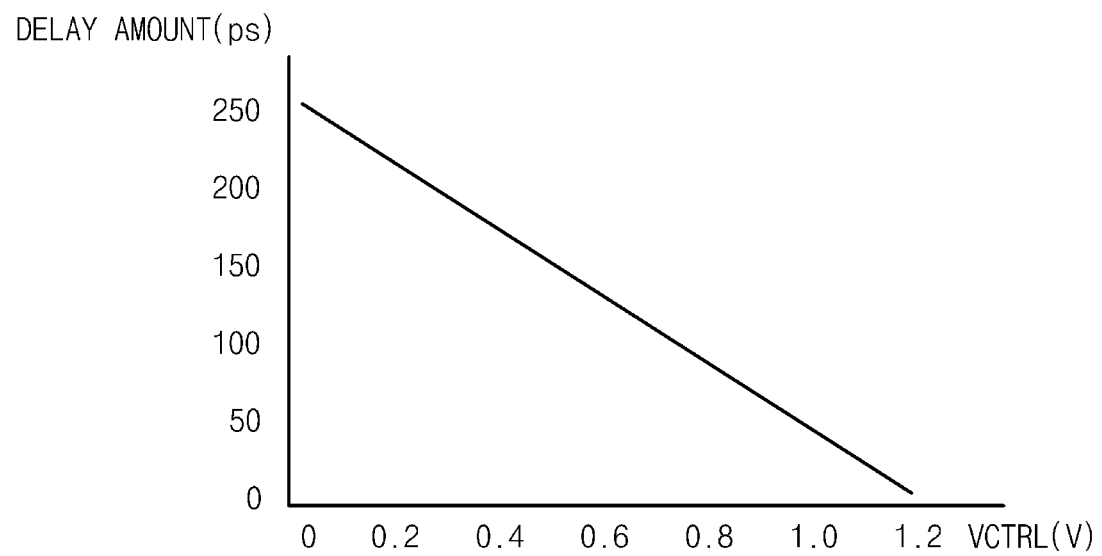
FIG. 4 is a representation of an example of a graph to assist in the explanation of the relationship between a control voltage and a delay amount in accordance with an embodiment.

FIG. 4 is a representation of an example of a graph to assist in the explanation of the relationship between a control voltage and a delay amount in accordance with an embodiment.

In FIG. 4, the X-axis represents the magnitude (i.e., in volts V) of the control voltage VCTRL, and the Y-axis represents the delay amount (i.e., in picoseconds ps) of the output test signal TOUT.

Referring to FIG. 4, it may be seen that, as described above, the delay amount of the output test signal TOUT decreases as the magnitude of the control voltage VCTRL increases. Further, it may be seen that the decrease in the delay amount of the output test signal TOUT is linear.

Figure 5A:
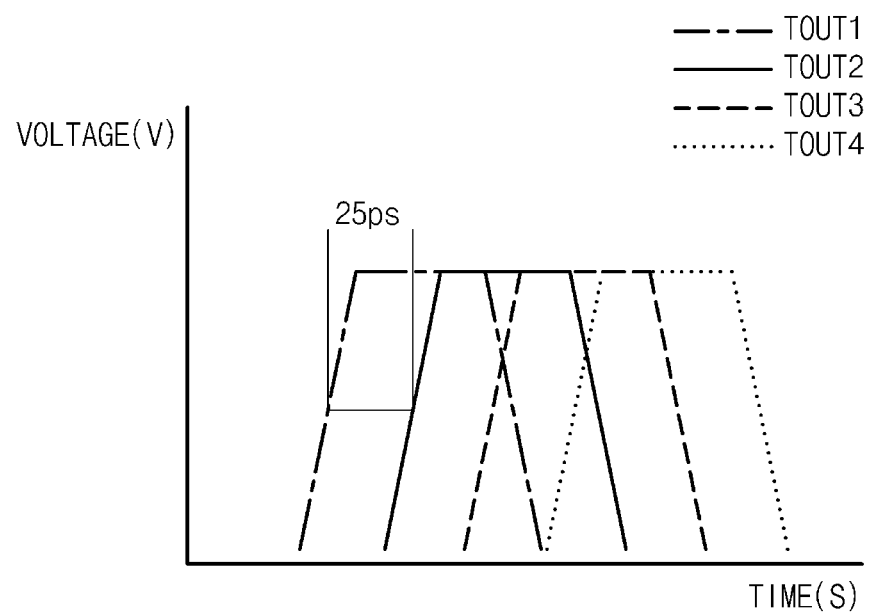
FIGS. 5A and 5B are representations of examples of graphs to assist in the explanation of output test signals generated in a plurality of voltage-control delay circuits.
Figure 5B:
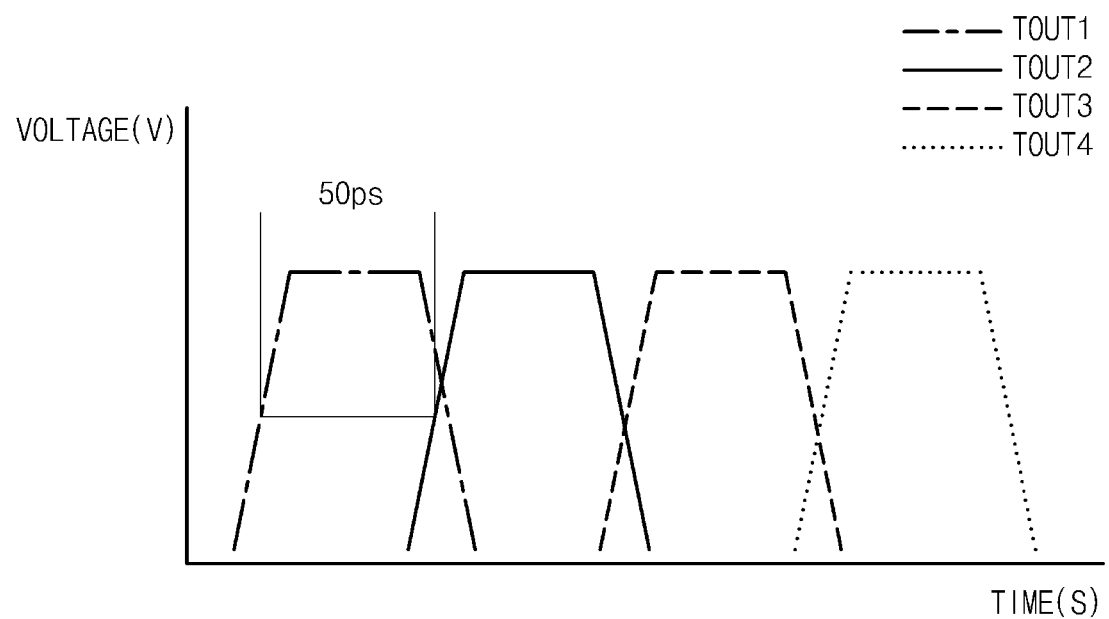

FIGS. 5A and 5B are representations of examples of graphs to assist in the explanation of the output test signals TOUT1, TOUT2, TOUT3 and TOUT4 which may be generated in the plurality of voltage-control delay circuits 401, 403, 405 and 407.

FIG. 5A illustrates the case where the external control signal EXTCTRL of 0.5V is provided to the control voltage generation circuit 300 through the fifth pad 211 of FIG. 1.

If the external control signal EXTCTRL is provided to the fifth pad 211 of FIG. 1, the control voltage generation circuit 300 generates and provides the first control voltage VCTRL1 of 0.4V, the second control voltage VCTRL2 of 0.3V, the third control voltage VCTRL3 of 0.2V and the fourth control voltage VCTRL4 of 0.1V, to the plurality of voltage-control delay circuits 401, 403, 405 and 407.

The first voltage-control delay circuit 401 linearly delays the first input test signal TIN1 based on the first control voltage VCTRL1, and provides the first output test signal TOUT1 to the test target circuit 500.

In a similar manner, the second to fourth voltage-control delay circuits 403, 405 and 407 linearly delay the second to fourth input test signals TIN2, TIN3 and TIN4, and provide the second to fourth output test signals TOUT2, TOUT3 and TOUT4 to the test target circuit 500.

Referring to FIG. 5A, the respective output test signals TOUT1, TOUT2, TOUT3 and TOUT4 are delayed and provided while having the same interval of 25 ps.

Since the electrical path from the first test pad 201 to the test target circuit 500 is longest, the delay amount of the first output test signal TOUT1 is smallest.

As illustrated in FIG. 5A, as the plurality of output test signals TOUT1, TOUT2, TOUT3 and TOUT4 are provided to the test target circuit 500 while having different delay amounts, the test target circuit 500 may receive the output test signals TOUT1, TOUT2, TOUT3 and TOUT4 which are synchronized at one time. Therefore, since wrong test results may be obtained only by the fail of the test target circuit 500 itself, the precision of a test may be improved.

FIG. 5B illustrates the example where the external control signal EXTCTRL is 1.0V.

In a manner similar to that described above with reference to FIG. 5A, according to application of the external control signal EXTCTRL, the first to fourth control voltages VCTRL1, VCTRL2, VCTRL3 and VCTRL4 have the magnitudes of 0.8V, 0.6V, 0.4V and 0.2V, respectively.

The first to fourth input test signals TIN1, TIN2, TIN3 and TIN4 are linearly controlled in their delay amounts, based on the first to fourth control voltages VCTRL1, VCTRL2, VCTRL3 and VCTRL4, respectively, and the first to fourth output test signals TOUT1, TOUT2, TOUT3 and TOUT4 are provided to the test target circuit 500.

Referring to FIG. 5B, it may be seen that the respective output test signals TOUT1, TOUT2, TOUT3 and TOUT4 are delayed to have the interval of 50 ps.

In this way, by controlling the external control signal EXTCTRL, it is possible to control the mismatches of the output test signals TOUT1, TOUT2, TOUT3 and TOUT4 provided to the test target circuit 500.

Figure 6:
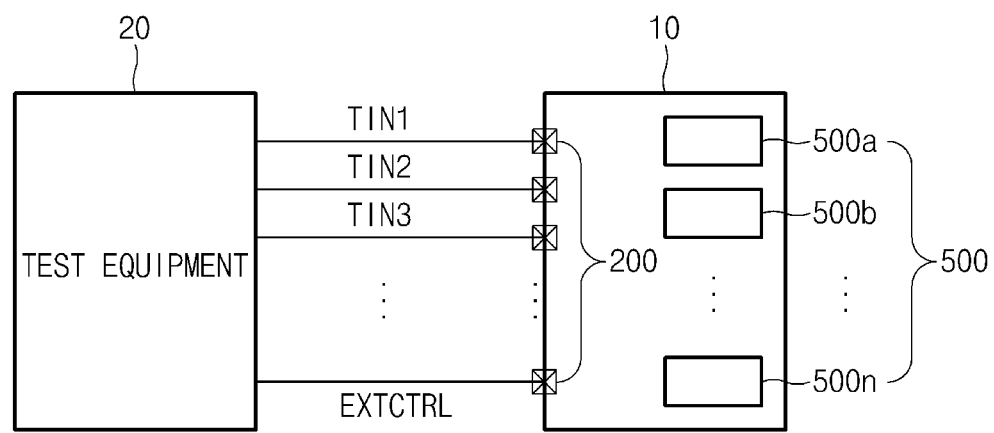
FIG. 6 is a block diagram illustrating a representation of an example of a test path compensating system including a test path compensating circuit, in accordance with an embodiment.

FIG. 6 is a block diagram illustrating a representation of an example of a test path compensating system including a test path compensating circuit, in accordance with an embodiment.

Referring to FIG. 6, a test path compensating system 1 may include a test path compensating circuit 10 and test equipment 20.

The test path compensating circuit 10 of FIG. 6 may include the same component elements as the test path compensating circuit 10 illustrated in FIG. 1. However, the test path compensating circuit 10 of FIG. 6 may include a plurality of test target circuits 500a, 500b, . . . , 500n. While FIG. 1 illustrates one test target circuit 500 for the sake of convenience in explanation of differences in the lengths of electrical paths, there may be the plurality of test target circuits 500a, 500b, . . . , 500n which are to be actually tested, as illustrated in FIG. 6.

The test equipment 20 may provide input test signals TIN1, TIN2, TIN3, . . . and an external control signal EXTCTRL to the test path compensating circuit 10 through pads 200.

The test path compensating circuit 10 may provide the input test signals TIN1, TIN2, TIN3, . . . received from the test equipment 20, to a certain test target circuit 500, as output test signals, based on the external control signal EXTCTRL.

The output test signals provided to the test target circuit 500 may be provided back to the test equipment 20 in such a manner that the output test signals are recognized by using strobe signals and so forth in the test target circuit 500 and are thus written in the test target circuit 500, and are then read from the test target circuit 500. Also, according to an embodiment, the test target circuit 500 may provide test results to the test equipment 20 after performing preset calculations for the recognized output test signals.

The test equipment 20 may receive the test results from the test target circuit 500 through the pads 200, and may determine whether the test target circuit 500 operates normally, by comparing the input test signals TIN1, TIN2, TIN3, . . . provided to the test path compensating circuit 10 with the test results. According to an embodiment, when the test equipment 20 receives the test results, the same pads as the pads through which the input test signals TIN1, TIN2, TIN3, . . . are provided may be used, or different pads may be used.

Further, the test equipment 20 may control the external control signal EXTCTRL according to a determination that is made for whether the test target circuit operates normally, according to the test results. The test equipment 20 may improve the reliability of test results by controlling the delay amounts of the plurality of input test signals TIN1, TIN2, TIN3, . . . according to the test results. Because delay amounts may be controlled through external pads, test delay amounts may be controlled regardless of in which manufacturing step the test path compensating circuit 10 is.

As is apparent from the above descriptions, in the test path compensating circuit and the test path compensating system according to the embodiments, since the delay amounts of test signals may be finely controlled through simple analog circuits, the precision of delay amount control may be improved when compared to conventional RC delay circuits.

Further, in the test path compensating circuit and the test path compensating system according to the embodiments, since not only skews according to electrical paths but also differences in reception times of input test signals according to variations in PVT (process, voltage and temperature) may be compensated for even after a final manufacturing step, it may be possible to flexibly cope with the operation characteristics of electronic devices and improve the reliability of tests.

Figure 7:
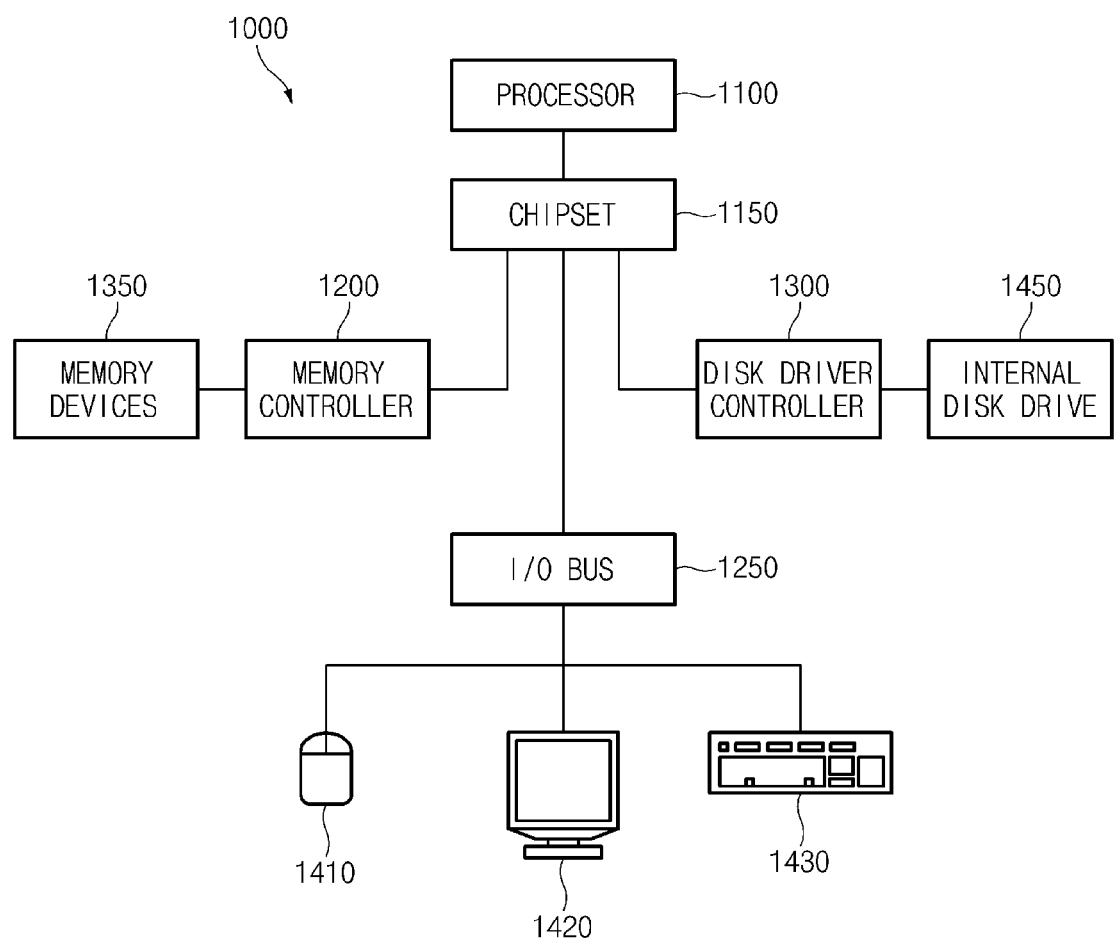
FIG. 7 illustrates a block diagram of an example of a representation of a system employing the test path compensating circuit in accordance with the embodiments discussed above with relation to FIGS. 1-6.

The test path compensating circuit discussed above (see FIGS. 1-6) are particular useful in the design of memory devices, processors, and computer systems. For example, referring to FIG. 7, a block diagram of a system employing the test path compensating circuit in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one test path compensating circuit as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one test path compensating circuit as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the test path compensating circuit as discussed above with relation to FIGS. 1-6. In alternate embodiments, such as cellular phones or digital cameras, the components may differ from the embodiments illustrated in FIG. 7.

While various embodiments have been described above, it will be understood to those skilled in the art that the embodiments described are by way of example only. Accordingly, the test path compensating circuit and the test path compensating system described herein should not be limited based on the described embodiments.

What is claimed is:

1. A test path compensating circuit comprising:
    a plurality of electrical paths electrically coupling a plurality of test pads to a test target circuit;
    a control voltage generation circuit configured to generate a plurality of control voltages; and
    a plurality of voltage-control delay circuits electrically coupled to the plurality of electrical paths, respectively, and configured to linearly control delay amounts of input test signals received from one or more of the plurality of test pads, based on one or more of the plurality of control voltages, and provide output test signals to the test target circuit.

2. The test path compensating circuit according to claim 1, wherein the plurality of control voltages is generated based on an external control signal received by the control voltage generation circuit.

3. The test path compensating circuit according to claim 2, wherein the control voltage generation circuit generates the plurality of control voltages having substantially the same voltage difference, based on the external control signal.

4. The test path compensating circuit according to claim 2, wherein the respective voltage-control delay circuits provide the output test signals by controlling the delay amounts according to ratios between a reference voltage and the control voltages.

5. The test path compensating circuit according to claim 4, wherein the delay amounts are linearly inversely proportional to the control voltages.

6. The test path compensating circuit according to claim 4, wherein each of the voltage-control delay circuits comprise a differential amplifier configured to receive and amplify the input test signal and generate a delayed input test signal by delaying the input test signal.

7. The test path compensating circuit according to claim 6, wherein the differential amplifier comprises:
    a first NMOS transistor including a first terminal electrically coupled with one end of a current mirror, and a gate terminal configured for receiving the delayed input test signal;
    a second NMOS transistor including a first terminal electrically coupled with a second terminal of the first NMOS transistor, a gate terminal configured for receiving the reference voltage, and a second terminal electrically coupled with a common current source;
    a third NMOS transistor including a first terminal electrically coupled with the other end of the current mirror, and a gate terminal configured for receiving the input test signal; and
    a fourth NMOS transistor including a first terminal electrically coupled with a second terminal of the third NMOS transistor, a gate terminal configured for receiving the control voltage, and a second terminal electrically coupled with the common current source,
    wherein the test output signal is provided from the first terminal of the third NMOS transistor.

8. The test path compensating circuit according to claim 7, wherein the first and third NMOS transistors and the second and fourth NMOS transistors are MOS transistor pairs each having the same characteristics.

9. The test path compensating circuit according to claim 1, wherein the electrical paths include at least one path that is different in length from the length of another path.

10. A test path compensating system comprising: test equipment configured to provide input test signals and an external control signal; and a test path compensating circuit configured to receive the input test signals through a plurality of test pads, linearly control delay amounts of the input test signals, based on a plurality of control voltages generated based on the external control signal, and provide the input test signals as output test signals.

11. The test path compensating system according to claim 10, wherein the test path compensating circuit comprises a test target circuit configured for receiving the output test signals, and
    wherein the test equipment determines whether the test target circuit operates normally, through signals outputted from the test target circuit.

12. The test path compensating system according to claim 10, wherein the test path compensating circuit comprises:
    a plurality of electrical paths having different lengths and connecting the plurality of test pads and the test target circuit;
    a control voltage generation circuit configured to generate the plurality of control voltages, based on the external control signal; and
    a plurality of voltage-control delay circuits electrically coupled to the plurality of electrical paths, respectively, and configured to linearly control the delay amounts of the input test signals received from one or more of the plurality of test pads, based on one or more of the plurality of control voltages, and provide the output test signals to the test target circuit.

13. The test path compensating system according to claim 12, wherein the control voltage generation circuit generates the plurality of control voltages having substantially the same voltage difference, based on the external control signal.

14. The test path compensating system according to claim 13, wherein the respective voltage-control delay circuits provide the output test signals by controlling the delay amounts according to ratios between a reference voltage and the control voltages.

15. The test path compensating system according to claim 14, wherein each of the voltage-control delay circuits comprise a differential amplifier configured to receive and amplify the input test signal and generate a delayed input test signal by delaying the input test signal.

16. The test path compensating system according to claim 15, wherein the differential amplifier comprises:
    a first NMOS transistor including a first terminal electrically coupled with one end of a current mirror, and a gate terminal configured for receiving the delayed input test signal;
    a second NMOS transistor including a first terminal electrically coupled with a second terminal of the first NMOS transistor, a gate terminal configured for receiving the reference voltage, and a second terminal electrically coupled with a common current source;

a third NMOS transistor including a first terminal electrically coupled with the other end of the current mirror, and a gate terminal configured for receiving the input test signal; and a fourth NMOS transistor including a first terminal electrically coupled with a second terminal of the third NMOS transistor, a gate terminal configured for receiving the control voltage, and a second terminal electrically coupled with the common current source, wherein the test output signal is provided from the first terminal of the third NMOS transistor.

17. A test path compensating circuit comprising:

a plurality of electrical paths electrically coupling a plurality of test pads to a test target circuit; and a plurality of voltage-control delay circuits electrically coupled to the plurality of electrical paths, respectively, and configured to control delay amounts of input test signals received from one or more of the plurality of test pads, based on differences in the electrical paths extending from test pads to the test target circuit.

18. The test path compensating circuit according to claim 17, wherein the differences include process, voltage and temperature differences of the plurality of electrical paths.

19. The test path compensating circuit according to claim 18, wherein the differences include length differences of the plurality of electrical paths.

20. The test path compensating circuit according to claim 17, wherein the plurality of voltage-control delay circuits are configured to linearly control the delay amounts of the input test signals from the one or more of the plurality of test pads.

* * * * *